United States Patent
Terazono et al.

(10) Patent No.: US 9,070,355 B2
(45) Date of Patent: Jun. 30, 2015

(54) ACOUSTIC GENERATOR, ACOUSTIC GENERATION DEVICE, AND ELECTRONIC DEVICE

(71) Applicant: KYOCERA Corporation, Kyoto-shi, Kyoto (JP)

(72) Inventors: Masaki Terazono, Kirishima (JP); Shigenobu Nakamura, Kirishima (JP)

(73) Assignee: KYOCERA CORPORATION, Kyoto-Shi, Kyoto (JP)

(*) Notice: Subject to any disclaimer, the term of this patent is extended or adjusted under 35 U.S.C. 154(b) by 0 days.

(21) Appl. No.: 14/375,181

(22) PCT Filed: May 31, 2013

(86) PCT No.: PCT/JP2013/065230
§ 371 (c)(1),
(2) Date: Jul. 29, 2014

(87) PCT Pub. No.: WO2014/050214
PCT Pub. Date: Apr. 3, 2014

(65) Prior Publication Data
US 2014/0367191 A1    Dec. 18, 2014

(30) Foreign Application Priority Data

Sep. 26, 2012  (JP) ................... 2012-212636

(51) Int. Cl.
*G10K 15/04*     (2006.01)
*H04R 17/10*     (2006.01)
(Continued)

(52) U.S. Cl.
CPC ............... *G10K 9/10* (2013.01); *H01L 41/083* (2013.01); *H04R 17/00* (2013.01); *H04R 2400/00* (2013.01); *H04R 2499/11* (2013.01); *H01L 41/0973* (2013.01); *H04R 31/00* (2013.01)

(58) Field of Classification Search
USPC ................ 181/142, 161, 166, 207, 208, 209; 381/190, 431, 162; 310/322, 323.01, 310/326, 327, 328, 321
See application file for complete search history.

(56) References Cited

U.S. PATENT DOCUMENTS 3,721,840 A * 3/1973 Yamada .................. 310/334
4,494,032 A * 1/1985 Martin .................... 310/324
(Continued)

FOREIGN PATENT DOCUMENTS

JP   H09-083105 A    3/1997
JP   2001-285994 A   10/2001
(Continued)

OTHER PUBLICATIONS

Korean Office Action with Statement of Relevance of Non-English references, Korean Patent Appln. No. 10-2013-7016892, Jul. 9, 2014, 5 pp.
(Continued)

*Primary Examiner* — Edgardo San Martin
(74) *Attorney, Agent, or Firm* — Volpe and Koenig, P.C.

(57) ABSTRACT

An object is to flatten a frequency characteristic. For achieving the object, an acoustic generator according to an embodiment includes a piezoelectric element (exciter) and a film (film-like vibrating body). The piezoelectric element receives input of an electric signal and vibrates. The piezoelectric element is bonded to the film through a bonding material and the film vibrates together with the piezoelectric element with the vibration of the piezoelectric element. Furthermore, the acoustic generator in the embodiment has voids in the bonding material.

15 Claims, 6 Drawing Sheets

(51) Int. Cl.
*G10K 9/10* (2006.01)
*H01L 41/083* (2006.01)
*H04R 31/00* (2006.01)
G10K 15/00 (2006.01)
H04R 17/00 (2006.01)
H01L 41/09 (2006.01)

(56) References Cited

U.S. PATENT DOCUMENTS

| | | | | |
|---|---|---|---|---|
| 4,654,554 | A * | 3/1987 | Kishi | 381/190 |
| 5,528,005 | A * | 6/1996 | Bschorr et al. | 181/208 |
| 5,621,701 | A * | 4/1997 | Denaro et al. | 367/151 |
| 7,240,766 | B2 * | 7/2007 | Rogers et al. | 181/209 |
| 8,335,329 | B2 * | 12/2012 | Kim et al. | 381/190 |
| 8,670,578 | B2 * | 3/2014 | Onishi et al. | 381/173 |
| 8,965,021 | B2 * | 2/2015 | Adamson et al. | 381/326 |
| 8,994,247 | B2 * | 3/2015 | Okamura et al. | 310/328 |
| 2013/0094681 | A1 | 4/2013 | Fukuoka et al. | |
| 2013/0301856 | A1 * | 11/2013 | Kim et al. | 381/190 |
| 2014/0233768 | A1 * | 8/2014 | Hirayama et al. | 381/190 |
| 2015/0003641 | A1 * | 1/2015 | Nakamura | 381/162 |
| 2015/0003642 | A1 * | 1/2015 | Nakamura | 381/162 |
| 2015/0003643 | A1 * | 1/2015 | Terazono et al. | 381/162 |

FOREIGN PATENT DOCUMENTS

| | | |
|---|---|---|
| JP | 2004-023436 A | 1/2004 |
| JP | 2007-180827 A | 7/2007 |
| JP | 4969706 B2 | 4/2012 |

OTHER PUBLICATIONS

International Search Report, PCT/JP2013/065230, Jul. 4, 2013, 1 pg.

* cited by examiner

ACOUSTIC GENERATOR, ACOUSTIC GENERATION DEVICE, AND ELECTRONIC DEVICE

CROSS-REFERENCE TO RELATED APPLICATIONS

This application is national stage application of International Application No. PCT/JP2013/065230, filed on May 31, 2013, which designates the United States, incorporated herein by reference, and which claims the benefit of priority from Japanese Patent Application No. 2012-212636, filed on Sep. 26, 2012, the entire contents of which are incorporated herein by reference.

FIELD OF INVENTION

The present invention relates to an acoustic generator, an acoustic generation device, and an electronic device.

BACKGROUND

Conventionally, acoustic generators represented by a piezoelectric speaker have been known as pieces of small-sized sound equipment driven with a low electrical current that use a piezoelectric body for an electroacoustic transducer element. For example, the acoustic generators are used as sound generation devices that are incorporated in small-sized electronic devices such as mobile computing apparatuses.

In general, the acoustic generators that use the piezoelectric body for the electroacoustic transducer element has the following configuration. That is, a piezoelectric element on which an electrode formed by a silver thin film or the like is formed is bonded to a vibration plate made of metal with an adhesive. A sound generation mechanism of the acoustic generator using the piezoelectric body for the electroacoustic transducer element generates shape distortion on the piezoelectric element by applying an alternate-current voltage to both the surfaces of the piezoelectric element and transmits the shape distortion of the piezoelectric element to the vibration plate made of metal so as to cause the vibration plate to vibrate.

CITATION LIST

Patent Literature

Patent Literature 1: Japanese Patent Application Laid-open No. 2001-285994
Patent Literature 2: Japanese Patent Application Laid-open No. 2004-023436

SUMMARY

Technical Problem

In the above-mentioned acoustic generator, there is a problem in that peaks and dips are easy to generate by distortion due to resonance induced with the vibration of the piezoelectric element and the sound pressure abruptly changes at a specific frequency. In consideration of this, flattening of a frequency characteristic of the sound pressure is required.

Solution to Problem

An acoustic generator, an acoustic generation device and an electronic device according to an embodiment includes an exciter and a film-like vibrating body. The exciter receives input of an electric signal and vibrates. The exciter is bonded to the film-like vibrating body through a bonding material and the film-like vibrating body vibrates together with the exciter with the vibration of the exciter. Furthermore, the acoustic generator, an acoustic generation device and an electronic device in the embodiment has voids in the bonding material.

DETAILED DESCRIPTION OF THE PREFERRED EMBODIMENTS

Hereinafter, embodiments of an acoustic generator, an acoustic generation device, and an electronic device that are disclosed by the present application are described in detail with reference to the drawings. The embodiments do not limit the invention. Respective modes, which will be described below as the embodiments, can be combined appropriately in a range where shapes and dimensions of respective members constituting the acoustic generator are consistent.

First Embodiment (Configuration of Acoustic Generator)

Figure 1A:
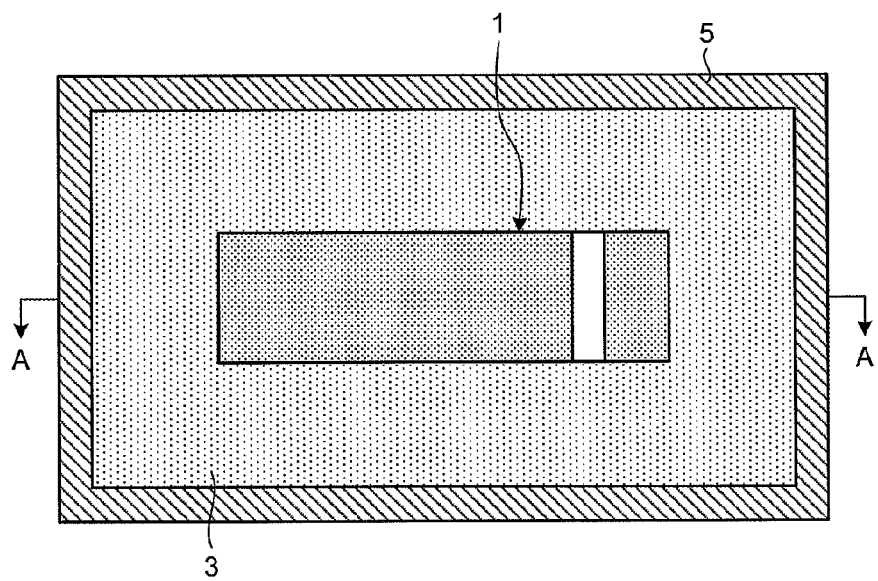
FIG. 1A is a plan view illustrating an acoustic generator according to a first embodiment.
Figure 1B:
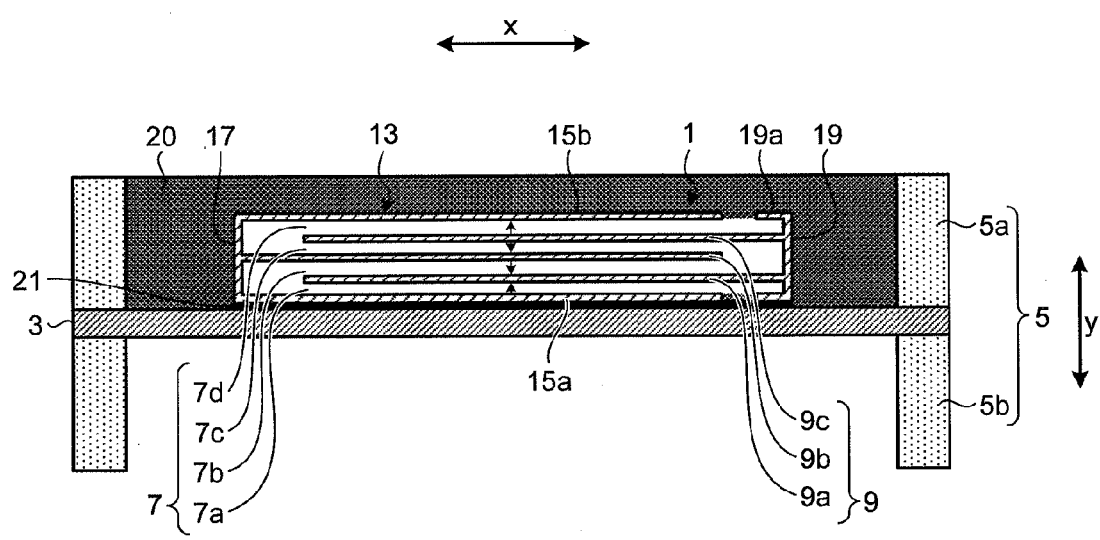
FIG. 1B is a cross-sectional view illustrating the acoustic generator in the first embodiment.

First, an example of the acoustic generator is described with reference to FIG. 1A and FIG. 1B. FIG. 1A is a plan view illustrating the acoustic generator. FIG. 1B is a cross-sectional view cut along line A-A in FIG. 1A. Furthermore, in FIG. 1B, a laminate-type piezoelectric element 1 as illustrated as an exciter in the thickness direction (y direction) is enlarged for facilitating easy understanding.

As the exciter that can be applied to the acoustic generator in the embodiment, any exciter that has a function of receiving input of an electric signal and exciting can be used in addition to the piezoelectric element 1, which will be described below. For example, an electrodynamic exciter, an electrostatic exciter, and an electromagnetic exciter that have been known as exciters vibrating a speaker may be used. The electrodynamic exciter applies an electric current to a coil arranged between magnetic poles of a permanent magnet to vibrate the coil. The electrostatic exciter applies a bias and an electric signal to two opposing metal plates to vibrate the metal plates. The electromagnetic exciter applies an electric signal to a coil to vibrate a thin iron sheet. In the embodiment, a film 3 is illustrated as a vibrating body.

The acoustic generator as illustrated in FIG. 1A and FIG. 1B has a configuration in which the piezoelectric element 1 serving as the exciter that receives input of an electric signal and vibrates is bonded onto the film 3 serving as the film-like vibrating body by a bonding material 21. In this case, the film 3 vibrates together with the piezoelectric element 1 with vibration of the piezoelectric element 1 serving as the exciter. The film 3 may be bonded to a frame member 5 that is quadrangular and opens at its center region, for example. In the acoustic generator, as illustrated in FIG. 1B, the film 3 is fixed to first and second frame members 5a and 5b by holding the film 3 between the first and second frame members 5a and 5b in a tensioned state and the laminate-type piezoelectric element 1 is arranged on the upper surface of the film 3. Although the frame member 5 may have a configuration in which the pair of frame members 5 hold the film 3 therebetween as illustrated in FIG. 1B, the film 3 is not necessarily held between the frame members 5. Alternatively, a configuration in which the frame member 5 is bonded to only one main surface of the film 3 may be employed from a viewpoint that the acoustic generator can be reduced in height and cost.

For example, the piezoelectric element 1 is formed into a plate form and the upper and lower main surfaces thereof have any one of rectangular shapes including a square shape and an oblong shape, polygonal shapes, and shapes having a curved portion on the outer circumference thereof. The piezoelectric element 1 serving as the exciter includes a laminate body 13, surface electrode layers 15a and 15b, and a pair of external electrodes 17 and 19, for example. The laminate body 13 is constituted by alternately laminating a piezoelectric body layer 7 formed by four-layered ceramics and a three-layered internal electrode layer 9. The surface electrode layers 15a and 15b are formed on both of the upper and lower main surfaces of the laminate body 13. The external electrodes 17 and 19 are provided on the respective ends of the laminate body 13 in the lengthwise direction x.

The external electrode 17 is connected to the surface electrode layers 15a and 15b and one internal electrode layer 9b. The external electrode 19 is connected to the two internal electrode layers 9a and 9c. The piezoelectric body layer 7 is polarized as indicated by an arrow in FIG. 1B and is configured as follows. That is, a voltage is applied to the external electrodes 17 and 19 so that the piezoelectric body layers 7c and 7d extend when the piezoelectric body layers 7a and 7b contract or the piezoelectric body layers 7c and 7d contract when the piezoelectric body layers 7a and 7b extend.

The upper and lower ends of the external electrode 19 extend to the upper and lower surfaces of the laminate body 13 and folding external electrodes 19a are formed thereon. The folding external electrodes 19a extend so as to be spaced from the surface electrode layers 15a and 15b formed on the surfaces of the laminate body 13 at a predetermined distance, respectively, so that they do not make contact with the surface electrode layers 15a and 15b.

The four-layered piezoelectric body layer 7 and the three-layered internal electrode layer 9 are formed by being sintered at the same time in a laminated state. The surface electrode layers 15a and 15b are formed by applying and baking pastes after producing the laminate body 13.

The main surface of the piezoelectric element 1 serving as the exciter at the film 3 side and the film 3 are bonded to each other by the bonding material 21. The thickness of the bonding material 21 between the piezoelectric element 1 serving as the exciter and the film 3 is set, for example, equal to or larger than 0.02 µm and equal to or smaller than 20 µm, particularly desirably, equal to or smaller than 10 µm. When the thickness of the bonding material 21 is equal to or smaller than 20 µm, it is easy to transmit the vibration of the laminate body 13 to the film 3.

As an adhesive for forming the bonding material 21, well-known resins such as an epoxy-based resin, a silicon-based resin, and a polyester-based resin can be used. The vibrating body can be manufactured using any method of thermal curing, light curing, and anaerobic curing as a method of curing the resin that is used for the adhesive.

In addition, in the acoustic generator in the first embodiment, a resin layer 20 may be formed on the film 3 by filling the inner side of the frame member 5a with a resin so as to embed the piezoelectric element 1. In FIG. 1A, the resin layer 20 is not illustrated for facilitating easy understanding.

An epoxy-based resin, an acrylic-based resin, a silicon-based resin, or rubber can be used for the resin layer 20. The resin layer 20 is preferably applied in a state of covering the piezoelectric element 1 completely from a viewpoint of preventing spurious. Preferably, a region of the film 3 that is not covered by the piezoelectric element 1 is also covered by the resin layer 20 in the same manner because the film 3 serving as a supporting plate vibrates integrally with the piezoelectric element 1.

In the acoustic generator in the first embodiment, an adequate dumping effect can be exhibited against the peaks and dips that are generated with a resonance phenomenon of the piezoelectric element 1 by embedding the piezoelectric element 1 in the resin layer 20 as described above. The dumping effect can moderate the resonance phenomenon and the peaks and dips to be small. This can reduce frequency dependence of the sound pressure.

As the piezoelectric body layer 7, existing piezoelectric ceramics such as non-lead-based piezoelectric body materials including lead zirconate (PZ), lead zirconium titanate (PZT), Bi laminar compound, and tungsten bronze structure compound can be used. The thickness of the piezoelectric body layer 7 is preferably 10 to 100 µm from a viewpoint of low-voltage drive.

As a material of the internal electrode layer 9, a material containing a metal component made of silver and palladium mainly and a material component forming the piezoelectric body layer 7 is desirably used. The internal electrode layer 9 is made to contain the ceramic component forming the piezoelectric body layer 7, so that a stress due to a thermal expansion difference between the piezoelectric body layer 7 and the internal electrode layer 9 can be reduced. This can provide the piezoelectric element 1 with no laminate failure. The material of the internal electrode layer 9 is not particularly limited to contain the metal component made of silver and palladium and may contain another metal component. In addition, the ceramic component is not limited to the material component forming the piezoelectric body layer 7 and may be another ceramic component.

The material of the surface electrode layers 15a and 15b and the external electrodes 17 and 19 desirably contains the metal component primarily made of silver and a glass component. The surface electrode layers 15a and 15b and the external electrodes 17 and 19 are made to contain the glass component so as to provide strong adhesion force between the piezoelectric body layer 7 or the internal electrode layer 9 and the surface electrode layers 15a and 15b or the external electrodes 17 and 19.

For example, the frame members 5a and 5b have the thickness of 100 to 5000 µm and are made of stainless. The material of the frame members 5a and 5b is not limited to stainless and may be a material that is more difficult to be deformed than the resin layer 20. For example, a hard resin, plastic, engineering plastic, ceramics, a glass, or the like can be used as the material of the frame members 5a and 5b. In this embodiment, the material, the thickness, and the like of the frame members 5a and 5b are not particularly limited. In addition, the frame shape is not also limited to the rectangular shape and a part or the entire of the inner circumferential portion or the outer circumferential portion thereof may be formed into a circular shape or an oval shape. Alternatively, the inner circumferential portion or the outer circumferential portion thereof may be formed into a rhombic shape.

As described above, the film 3 is fixed to the frame members 5a and 5b in a state of being tensioned in the planar direction by holding the outer circumferential portion of the film 3 between the frame members 5a and 5b and functions as the vibration plate. The thickness of the film 3 is preferably set to 10 to 200 µm, for example. A resin made of polyethylene, polyimide, polypropylene, polystyrene, or the like, or paper made of pulp, fiber, or the like can be preferably used as the material of the film 3. It should be noted that the material of the film 3 is not limited to the above-mentioned organic materials and may be metal-based materials as long as the film capable of functioning as the vibration plate providing desired sound characteristics can be formed. The peaks and dips can be moderated by using these materials.

(Bonding Material)

Figure 2:
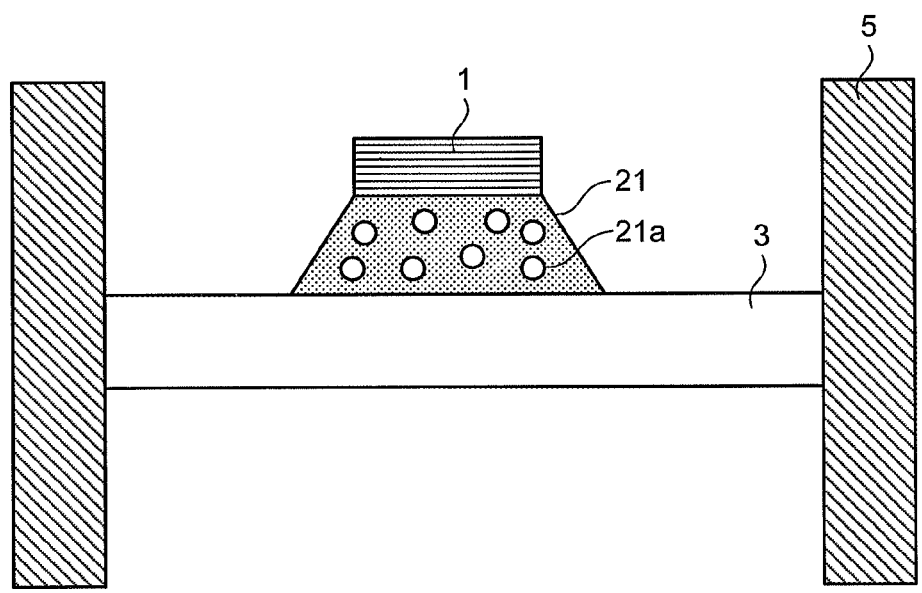
FIG. 2 is a schematic cross-sectional view illustrating the acoustic generator in the first embodiment.

Next, the bonding material 21 is described in detail. FIG. 2 is a schematic cross-sectional view illustrating the acoustic generator in the first embodiment. FIG. 2 is a cross-sectional view illustrating a portion necessary for explanation that is cut out from the cross-sectional view in FIG. 1B for enabling the state of the bonding material 21 to be observed easily.

In the acoustic generator in the embodiment, the piezoelectric element 1 is bonded onto the film 3 through the bonding material 21 and the bonding material 21 includes a large number of voids 21a, what are called "voids", in the bonding material 21 as illustrated in FIG. 2. Furthermore, the voids 21a are preferably formed into a sphere form so as to easily absorb the stress and the resonance energy from various directions in the bonding material 21. The voids 21a are formed into the sphere form, thereby improving the durability of the piezoelectric element 1 and the acoustic generator.

The diameter of each void 21a is preferably 0.01 to 100 µm. The diameter of the void 21a can be obtained as follows. That is, five arbitrary segments having the same length are drawn on an arbitrary cross section and values obtained by dividing the lengths of the voids 21a through which the respective segments transverse by the number of voids 21a are averaged.

The voids 21a are preferably provided at an interval of 0.1 to 100 µm. When the interval of the voids 21a is small, the peaks and dips on a high-tone region can be moderated. When the interval of the voids 21a is large, the peaks and dips on a low-tone region can be moderated. With this configuration, the voids having different diameters are preferably arranged at various intervals in order to obtain a flat frequency characteristic.

When the bonding material 21 is seen from the above, the voids 21a are preferably distributed along the peripheral edges of the piezoelectric element 1. The voids 21a are distributed in this manner, so that regions having different Young's modulus values can be dotted in the bonding material 21 at positions at which the piezoelectric element 1 is displaced at the highest level. This can make the resonance frequency difficult to be even at the highest level.

In this manner, the voids 21a are provided in the bonding material 21 for bonding the piezoelectric element 1 and the film 3, so that the regions having different Young's modulus values are dotted in the bonding material 21. With this configuration, the resonance frequency is made uneven partially and the sound pressure peaks at resonance points become moderate. As a result, the peaks and dips are moderated so as to flatten the frequency characteristic.

In this case, by embedding the piezoelectric element 1 in the resin layer 20, not only the adequate dumping effect can be exhibited against the peaks and dips that are generated due to the resonance phenomenon of the piezoelectric element 1 but also signal waves having uneven resonance frequencies are reflected and hit in the resin layer 20. This can moderate the peak strengths at the resonance frequencies so as to further flatten the frequency characteristic.

The bonding material 21 desirably adheres to the entire main surface of the piezoelectric element 1 in order to enhance bonding property between the piezoelectric element 1 and the film 3. The number of voids 21a as illustrated in FIG. 2 is merely an example and does not limit the embodiment.

The epoxy-based resin, the silicon-based resin, or the acryl-based resin is particularly preferably used as the adhesive for forming the bonding material 21. When the adhesive made of any of these materials is used for the bonding material 21, adhesion strength to the film 3 is enhanced, thereby improving durability of the bonding material 21. This can also improve the durability as the acoustic generator.

(Manufacturing Method)

A method of manufacturing the acoustic generator in the invention is described.

First, the bimorph piezoelectric element 1 is prepared. The piezoelectric element 1 is manufactured by kneading a binder, a dispersing agent, a plasticizer, and a solvent into powder of a piezoelectric material so as to prepare slurry. A lead-based or non-lead-based piezoelectric material can be used as the piezoelectric material.

Next, the above-mentioned slurry is shaped into a sheet form so as to obtain a green sheet. Internal electrode pastes are printed on the green sheet so as to form an internal electrode pattern. Three green sheets on which the electrode patterns have been formed are laminated on one another. Only the green sheet is laminated at the uppermost layer so as to prepare a laminate compact.

Subsequently, the above-mentioned laminate compact is degreased, sintered, and cut into a predetermined dimension so as to obtain the laminate body 13. The outer circumferential portion of the laminate body 13 is processed if necessary and pastes of the surface electrode layers 15a and 15b are printed on the main surfaces of the laminate body 13 in the lamination direction of the piezoelectric body layer 7. Thereafter, the external electrodes 17 and 19 are printed on the respective end surfaces of the laminate body 13 in the lengthwise direction x. The electrodes are then baked at a predetermined temperature so as to obtain the bimorph piezoelectric element 1 as illustrated in FIG. 1A and FIG. 1B.

A direct-current voltage is then applied to the bimorph piezoelectric element 1 through the surface electrode layers 15a and 15b or the external electrodes 17 and 19 in order to give piezoelectricity to the bimorph piezoelectric element 1. Polarization of the piezoelectric body layer 7 of the bimorph piezoelectric element 1 is performed. The polarization is performed by applying the DC voltage in the direction as indicated by the arrow in FIG. 1B.

Subsequently, the film 3 serving as the support member is prepared and the outer circumferential portion of the film 3 is held between the frame members 5a and 5b so as to fix the film 3 in the tensioned state. Thereafter, the adhesive or the like forming the bonding material 21 is applied to the piezoelectric element 1 or the film 3 or both of them. The bimorph piezoelectric element 1 at the surface electrode layer 15a side is then pressed on the film 3, and thereafter, heat and ultraviolet rays are applied to the bonding material 21 to cure the bonding material 21. The resin is then made to flow into the inner side of the frame member 5a. Thereafter, the bimorph piezoelectric element 1 is completely embedded and the resin layer 20 is cured, thereby obtaining the acoustic generator in the first embodiment.

In this case, when the bonding material 21 is applied to the film 3 or when heat and ultraviolet rays are applied to the bonding material 21, the air is made to blow into the adhesive forming the bonding material 21 or shell-like particles are mixed into the adhesive forming the bonding material 21 in order to form the voids 21a in the bonding material 21. With this process, the voids 21a can be formed in the bonding material 21.

Second Embodiment

Figure 3A:
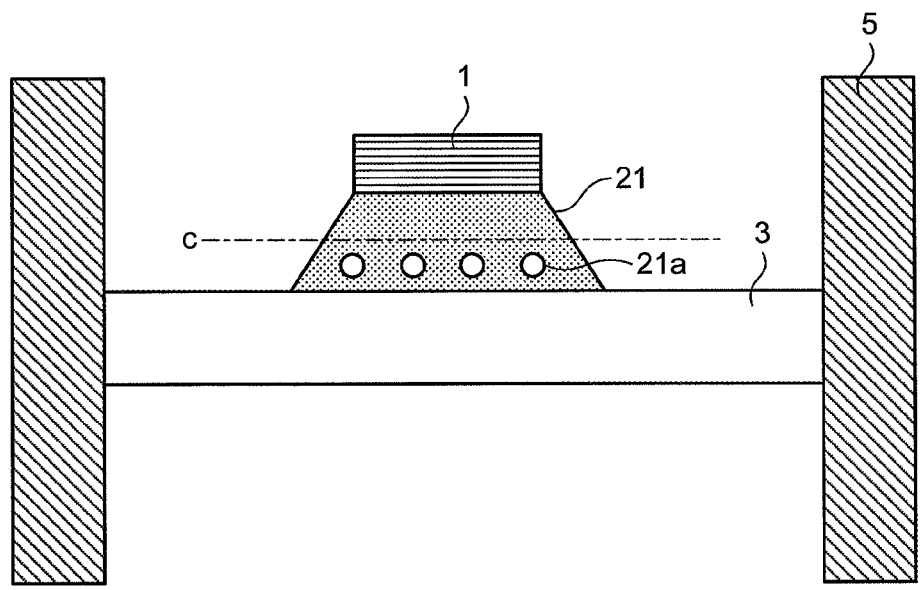
FIG. 3A is a schematic cross-sectional view illustrating an acoustic generator according to a second embodiment, and illustrates a mode in which voids are present at the vibrating body side in a bonding material.
Figure 3B:
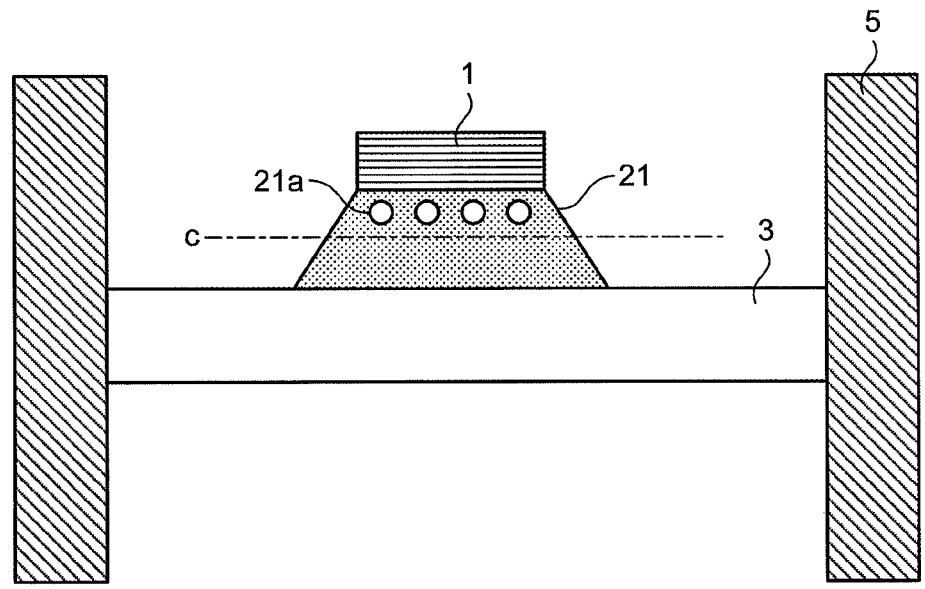
FIG. 3B is a schematic cross-sectional view illustrating the acoustic generator in the second embodiment, and illustrates a mode in which voids are present at the exciter side in the bonding material.

An example in which a region including the voids 21a is different from that in the first embodiment is described. FIG. 3A and FIG. 3B are schematic cross-sectional views illustrating an acoustic generator in a second embodiment. FIGS. 3A and 3B are cross-sectional views illustrating a portion necessary for explanation that is cut out from the cross-sectional view in FIG. 1B as in FIG. 2.

As illustrated in FIG. 3A, the bonding material 21 has the voids 21a at the film 3 side relative to a dotted line c indicating the center of a distance between the piezoelectric element 1 and the film 3. The voids 21a are present at the film 3 side in this manner, and these voids 21a reduce noise of vibration and weaken a stress to the film 3 side. This makes cracking difficult to be generated on the interface between the film 3 and the bonding material 21. As a result, sound stability and durability can be improved.

The configuration in which the voids 21a are provided at the film 3 side is achieved as follows, for example. The adhesive or the like forming the bonding material 21 is applied to the piezoelectric element 1. After that, it is sufficient that the piezoelectric element 1 is left gently with the bonding material 21 facing upward using the phenomenon that the voids 21a float to the upper surface of the bonding material 21 and the film 3 is bonded from the upper surface thereof.

On the other hand, the bonding material 21 as illustrated in FIG. 3B has the voids 21a at the piezoelectric element 1 side relative to the dotted line c indicating the center of the distance between the piezoelectric element 1 and the film 3. The voids 21a are present at the piezoelectric element 1 side in this manner, and these voids 21a absorb the vibration of the piezoelectric element 1 serving as a driving source. This can reduce the stress on the interface between the piezoelectric element 1 and the bonding material 21 so as to improve the durability. In addition, because heat generated on the piezoelectric element 1 is difficult to be transmitted and tension of the film 3 is stabilized, sound distortion is not easy to be generated. Furthermore, the voids 21a inhibit the transmission of the vibration from the piezoelectric element 1. With this configuration, the resonance peaks in the film 3 become more moderate toward the piezoelectric element 1 and the sound pressure peaks at the resonance points in the plane of the film 3 fluctuate so as to flatten the frequency characteristics.

The configuration in which the voids 21a are provided at the piezoelectric element 1 side is achieved as follows, for example. The adhesive or the like forming the bonding material 21 is applied to the film 3. After that, it is sufficient that the film 3 is left gently with the bonding material 21 facing upward using the phenomenon that the voids 21a float to the upper surface of the bonding material 21, and the piezoelectric element 1 is then bonded from the upper surface thereof.

Third Embodiment

Figure 4:
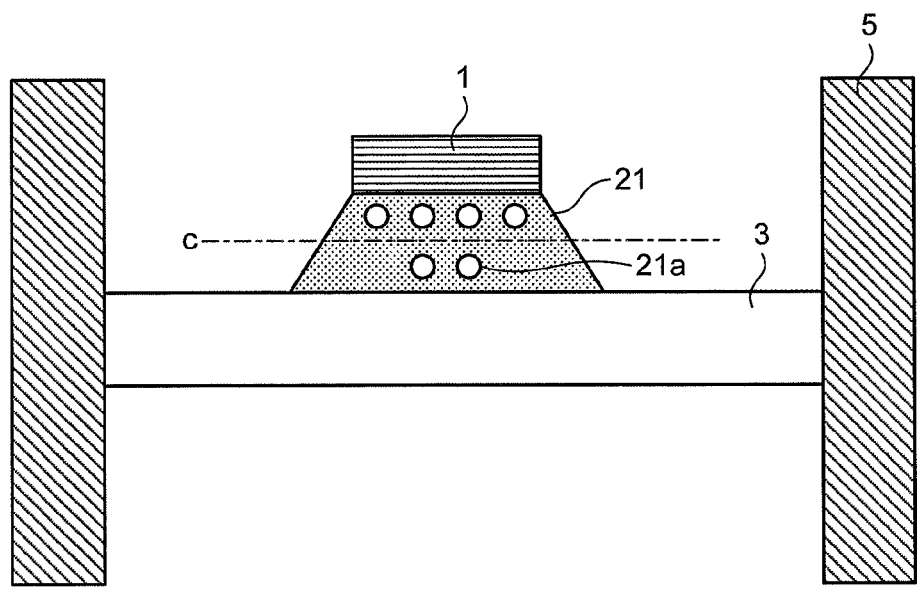
FIG. 4 is a schematic cross-sectional view illustrating an acoustic generator according to a third embodiment.

Although the example in which the voids 21a in the bonding material 21 are present at one side, that is, at the piezoelectric element 1 side or the film 3 side has been described in the second embodiment, the invention is not limited thereto. In a third embodiment, an example in which more voids 21a are present at the piezoelectric element 1 side than those at the film 3 side is described. FIG. 4 is a schematic cross-sectional view illustrating an acoustic generator in the third embodiment. FIG. 4 is a cross-sectional view illustrating a portion necessary for explanation that is cut out from the cross-sectional view in FIG. 1B as in FIGS. 3A and 3B.

As illustrated in FIG. 4, the bonding material 21 includes more voids 21a at the piezoelectric element 1 side than those at the film 3 side with respect to the dotted line c indicating the center of the distance between the piezoelectric element 1 and the film 3. In this manner, because more voids 21a are present at the piezoelectric element 1 side than those at the film 3 side, the voids 21a can absorb the vibration of the piezoelectric element 1 serving as the driving source and can reduce noise of the vibration. As a result, sound stability can be improved while keeping durability.

The configuration in which more voids 21a are present at the piezoelectric element 1 side than those at the film 3 side is achieved as follows. For example, the adhesive or the like forming the bonding material 21 is applied to the film 3. After that, it is sufficient that the film 3 is left gently with the bonding material 21 facing upward using the phenomenon that the voids 21a float to the upper surface of the bonding material 21, and the piezoelectric element 1 is bonded from the upper surface thereof before all the voids 21a float.

Fourth Embodiment

Figure 5A:
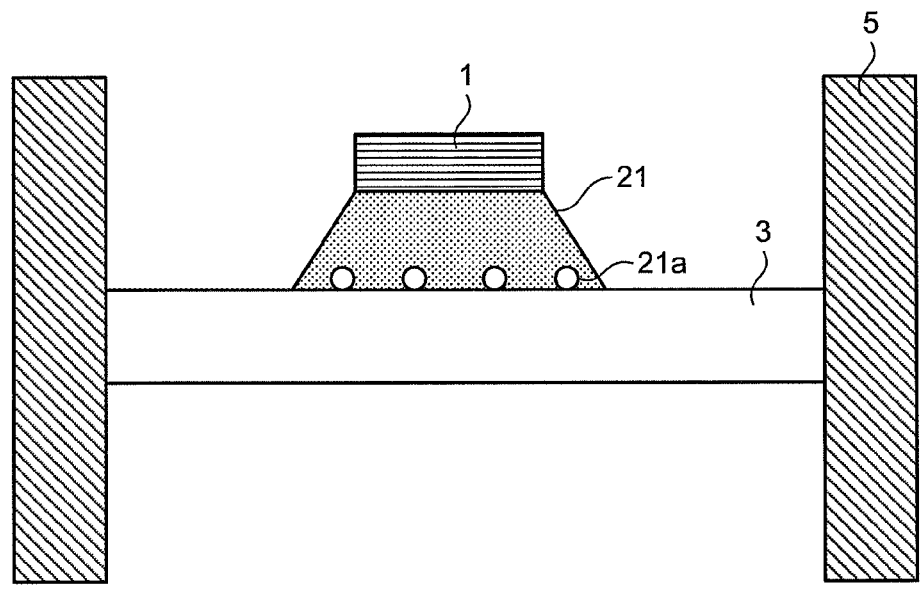
FIG. 5A is a schematic cross-sectional view illustrating an acoustic generator according to a fourth embodiment, and illustrates a mode in which voids are present on an interface between the vibrating body and the bonding material.
Figure 5B:
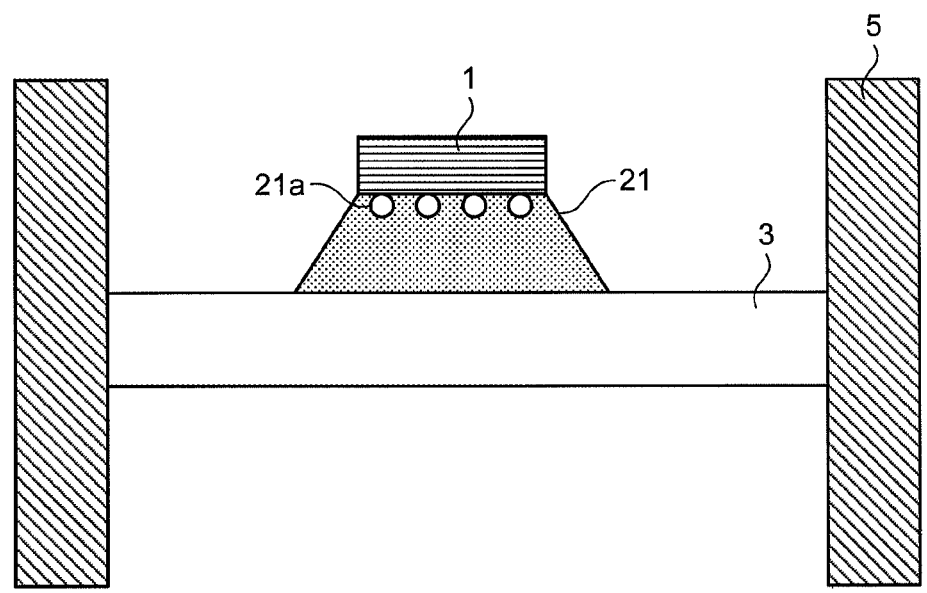
FIG. 5B is a schematic cross-sectional view illustrating the acoustic generator in the fourth embodiment, and illustrates a mode in which voids are present on an interface between the exciter and the bonding material.

Next, another embodiment is described for a region on which the voids 21a in the bonding material 21 are present. FIG. 5A and FIG. 5B are schematic cross-sectional views illustrating an acoustic generator in a fourth embodiment. FIGS. 5A and 5B are cross-sectional views illustrating a portion necessary for explanation that is cut out from the cross-sectional view in FIG. 1B as in FIGS. 3A and 3B.

As illustrated in FIG. 5A, the bonding material 21 has the voids 21a on the interface between the bonding material 21 and the film 3. In other words, the voids 21a face the interface between the bonding material 21 and the film 3. In this manner, even when the voids 21a are made to be present on the interface between the bonding material 21 and the film 3, the voids 21a weaken the stress to the film 3 side. This makes cracking difficult to be generated on the interface between the film 3 and the bonding material 21. As a result, durability can be improved. The interface indicates a surface on which the bonding material 21 and the film 3 make contact with each other. A thin layer (for example, equal to or smaller than 0.05

μm) of the bonding material 21 is present between the voids 21a and the film 3 in some cases when seen on a cross section.

The configuration in which the voids 21a face the interface between the bonding material 21 and the film 3 is achieved as follows. When the adhesive or the like forming the bonding material 21 is applied to the piezoelectric element 1, mesh is made larger in the case of the screen printing and scanning is performed while pulsating or elevating a needle in the case of application with a dispenser so that the surface thereof is uneven. Thereafter, the piezoelectric element 1 is left gently with the bonding material 21 facing upward using the phenomenon that the voids 21a float to the upper surface of the bonding material 21, and the film 3 is then bonded from the upper surface thereof. Furthermore, the piezoelectric element 1 is made to reciprocate along the surface of the film 3 while being pressurized and is bonded to the surface of the film 3.

On the other hand, the bonding material 21 as illustrated in FIG. 5B has the voids 21a on the interface between the bonding material 21 and the piezoelectric element 1. In other words, the voids 21a face the interface between the bonding material 21 and the piezoelectric element 1. That is to say, the voids 21a are present on the interface between the bonding material 21 and the piezoelectric element 1, that is, the voids 21a are present in the just-under direction from the piezoelectric element 1 to the film 3. With this configuration, when the piezoelectric element 1 vibrates abnormally with an abnormal signal, the voids 21a can absorb the vibration, thereby improving durability of the piezoelectric element 1 or the acoustic generator.

The configuration in which the voids 21a face the interface between the bonding material 21 and the piezoelectric element 1 is achieved as follows. When the adhesive or the like forming the bonding material 21 is applied to the film 3, mesh is made larger in the case of the screen printing and scanning is performed while pulsating or elevating a needle in the case of application with a dispenser so that the surface thereof is uneven. Thereafter, the piezoelectric element 1 is left gently with the bonding material 21 facing upward using the phenomenon that the voids 21a float to the upper surface of the bonding material 21, and the piezoelectric element 1 is then bonded from the upper surface thereof. Furthermore, the piezoelectric element 1 is made to reciprocate along the surface of the film 3 while being pressurized and is bonded to the surface of the film 3.

Fifth Embodiment

Figure 6:
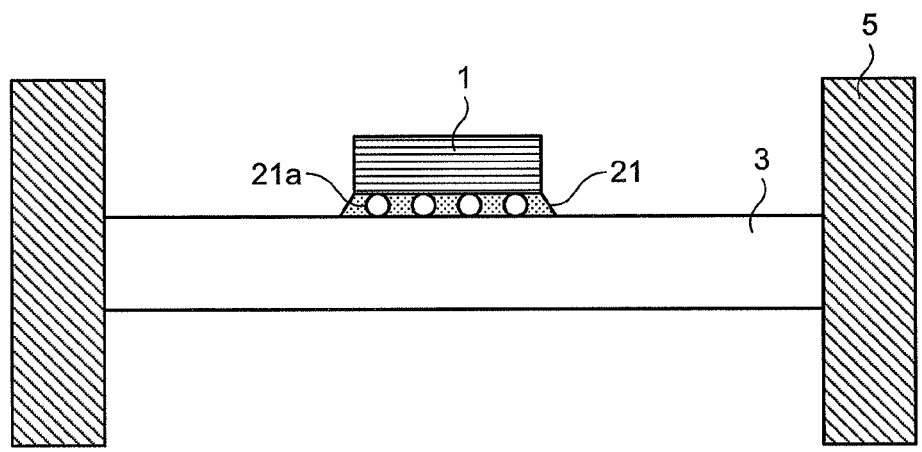
FIG. 6 is a schematic cross-sectional view illustrating an acoustic generator according to a fifth embodiment, and illustrates a mode in which voids penetrate through a bonding material from the exciter side to the vibrating body side.

Next, another embodiment is described for a region on which the voids 21a in the bonding material 21 are present is described. FIG. 6 is a schematic cross-sectional view illustrating an acoustic generator in a fifth embodiment. FIG. 6 is a cross-sectional view illustrating a portion necessary for explanation that is cut out from the cross-sectional view in FIG. 1B as in FIGS. 3A and 3B.

As illustrated in FIG. 6, the bonding material 21 has the voids 21a facing the interface between the bonding material 21 and the piezoelectric element 1 and the interface between the bonding material 21 and the film 3. In other words, the voids 21a penetrate through the inner portion of the bonding material 21 from the exciter (piezoelectric element 1) side to the vibrating body (film 3) side. When the voids 21a are made to penetrate through the inner portion of the bonding material 21 in this manner, a region in which vibration is transmitted to the film 3 from the piezoelectric element 1 through the bonding material 21 and a region in which vibration is transmitted through the air both exist. In this case, because the transmission speed in the bonding material 21 and the transmission speed in the air are different, the resonance frequency is uneven. This can provide the acoustic generator having extremely excellent frequency characteristic. The interface between the bonding material 21 and the film 3 indicates the surface on which the bonding material 21 and the film 3 make contact with each other. A thin layer (for example, equal to or smaller than 0.05 μm) of the bonding material 21 is present between the voids 21a and the film 3 in some cases when seen on a cross section.

The configuration in which the voids 21a penetrate through the inner portion of the bonding material 21 from the exciter (piezoelectric element 1) side to the vibrating body (film 3) side is achieved as follows. When the adhesive or the like forming the bonding material 21 is applied to the piezoelectric element 1 or the film 3, it is sufficient that partial printing is performed so as to form the voids 21a without applying the adhesive or the like to the entire surface. For example, pattern printing is performed in the case of the screen printing and scanning is performed while a scanning interval is made larger relative to a needle diameter in the case of application with the dispenser. Thereafter, after checking that the voids 21a are left, the piezoelectric element 1 and the film 3 are bonded to each other. In addition, the piezoelectric element 1 is made to reciprocate along the surface of the film 3 while being pressurized. The piezoelectric element 1 is bonded to the surface of the film 3 such that the bonding material 21 protrudes to the outer side of the piezoelectric element 1.

Sixth Embodiment

Although the respective modes of the embodiments have been described above, the embodiments may be executed in various different modes other than the above-mentioned modes. Hereinafter, other modes included in the embodiments are described.

An acoustic generator according to another embodiment has a protruding portion on which the bonding material 21 protrudes from the outer edges of the exciter (piezoelectric element 1). With this configuration, regions in which only the film 3 vibrates and regions in which the film 3 and the bonding material 21 vibrate in a bonded manner both exist around the piezoelectric element 1 and respective resonance conditions are different. This can make the resonance frequency difficult to be even so as to further moderate the peaks and dips.

In addition, the protruding portion that protrudes from the outer edges of the exciter (piezoelectric element 1) includes the voids 21a. With this configuration, not only the resonance conditions are different but also vibration is moderated with the voids 21a. This can make the resonance frequency difficult to be even so as to further moderate the peaks and dips.

(Application Range)

For example, although the bimorph piezoelectric element is described in the first embodiment, the invention is not limited thereto. That is to say, the invention is not limited to the bimorph piezoelectric element and the same effects can be obtained with a unimorph piezoelectric element by using the bonding material 21 that is the same as that in any of the first to the sixth embodiments.

(Speaker Apparatus)

The acoustic generator as described in each of the first to the sixth embodiments can be also configured as an acoustic generation device, what is called a "speaker apparatus" by accommodating the acoustic generator in a housing for accommodating the acoustic generator, what is called a resonant box. For example, the acoustic generator can be also configured as a large-sized speaker apparatus that is used for televisions, personal computers, and the like. In addition, the acoustic generator can be also configured as a middle-sized or small-sized speaker apparatus that is mounted on mobile terminals such as smart phones, mobile phones, personal handyphone systems (PHS), and personal digital assistants (PDA). The speaker apparatus is not limited to the above-mentioned applications and the speaker apparatus can be configured as a speaker apparatus that is mounted on arbitrary electronic devices such as cleaners, washers, and refrigerators.

(Electronic Device)

The acoustic generator as described in each of the first to the sixth embodiments includes at least an electronic circuit connected to the acoustic generator and a housing that accommodates the electronic circuit and the acoustic generator and can be also configured as an electronic device having a function of generating sound from the acoustic generator. Examples of the electronic device include televisions, personal computers, various mobile terminals, cleaners, washers, and refrigerators.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. An acoustic generator comprising:
   an exciter that receives input of an electric signal and vibrates; and
   a film-like vibrating body to which the exciter is bonded through a bonding material and that vibrates together with the exciter with vibration of the exciter, wherein the bonding material has voids.

2. The acoustic generator according to claim 1, wherein the voids penetrate through from the exciter side to the vibrating body side.

3. The acoustic generator according to claim 1, wherein more voids are present at the vicinity of the exciter than the voids present at the vicinity of the vibrating body in the bonding material.

4. The acoustic generator according to claim 1, wherein the voids are present at the vibrating body side in the bonding material.

5. The acoustic generator according to claim 1, wherein the voids are present at the exciter side in the bonding material.

6. The acoustic generator according to claim 1, wherein the voids face an interface between the bonding material and the vibrating body.

7. The acoustic generator according to claim 1, wherein the voids face an interface between the bonding material and the exciter.

8. The acoustic generator according to claim 1, wherein the bonding material comprises a protruding portion that protrudes from an outer edge of the exciter.

9. The acoustic generator according to claim 8, wherein the voids are present in the protruding portion.

10. The acoustic generator according to claim 1, wherein a resin layer is provided on the vibrating body so as to embed the exciter.

11. The acoustic generator according to claim 1, wherein the voids are formed into a sphere form.

12. The acoustic generator according to claim 1, wherein the exciter is formed by a piezoelectric element.

13. The acoustic generator according to claim 12, wherein the exciter is formed by a bimorph piezoelectric element.

14. An acoustic generation device comprising:
    the acoustic generator according to claim 1; and
    a housing that accommodates the acoustic generator.

15. An electronic device comprising:
    the acoustic generator according to claim 1;
    an electronic circuit that is connected to the acoustic generator; and
    a case that accommodates the electronic circuit and the acoustic generator, wherein
    the electronic device has a function of generating sound from the acoustic generator.

* * * * *